United States Patent [19]

Fazekas

[11] Patent Number: 4,721,855
[45] Date of Patent: Jan. 26, 1988

[54] METHOD AND APPARATUS FOR RAPID MEASUREMENTS OF ELECTRICAL SIGNALS AT CIRCUIT NODES OF INTEGRATED CIRCUITS IN WHICH NOISE SIGNALS ARE ALSO DETECTED

[75] Inventor: Peter Fazekas, Munich, Fed. Rep. of Germany

[73] Assignee: Siemens Aktiengesellschaft, Berlin and Munich, Fed. Rep. of Germany

[21] Appl. No.: 632,474

[22] Filed: Jul. 19, 1984

[30] Foreign Application Priority Data

Sep. 23, 1983 [DE] Fed. Rep. of Germany ....... 3334530

[51] Int. Cl.⁴ ............................................. G01R 31/26
[52] U.S. Cl. ................................ 250/310; 324/158 D; 324/158 R; 250/307
[58] Field of Search ............... 250/307, 310, 397, 399, 250/492.2, 311; 324/158 D, 158 R, 73 PC

[56] References Cited

U.S. PATENT DOCUMENTS

| | | | |
|---|---|---|---|
| 4,220,854 | 9/1980 | Feuerbaum | 250/310 |
| 4,227,679 | 7/1981 | Feuerbaum | 250/310 |
| 4,387,304 | 6/1983 | Younkin | 250/492.2 |
| 4,477,775 | 10/1984 | Fazekas | 250/310 |

FOREIGN PATENT DOCUMENTS

| | | | |
|---|---|---|---|
| 3040733 | 5/1982 | Fed. Rep. of Germany . | |
| 3235700 | 3/1984 | Fed. Rep. of Germany | 250/310 |
| 0149424 | 7/1981 | German Democratic Rep. | 324/158 R |
| 5872035 | 4/1983 | Japan | 324/158 R |

Primary Examiner—Craig E. Church
Assistant Examiner—Paul A. Guss
Attorney, Agent, or Firm—Hill, Van Santen, Steadman & Simpson

[57] ABSTRACT

A method for measuring electrical signals according to a sampling principle with the assistance of an electron probe, whereby the signal is respectively repeatedly sampled in succession at different phase points, enables a fast registration of an electrical signal at a circuit node of an integrated circuit and simultaneously permits registration when at least one noise signal appears between two clock edges of a basic pulse rate of the integrated circuit. Between two successive phase points at which the signal is repeatedly sampled in succession for potential measurement, only a check is executed at phase points by sampling as to whether a noise signal exists in this intermediate region.

6 Claims, 5 Drawing Figures

METHOD AND APPARATUS FOR RAPID MEASUREMENTS OF ELECTRICAL SIGNALS AT CIRCUIT NODES OF INTEGRATED CIRCUITS IN WHICH NOISE SIGNALS ARE ALSO DETECTED

BACKGROUND OF THE INVENTION

1. Field of the Invention

The present invention relates to a method and apparatus for measuring electrical signals at circuit nodes of integrated circuits according to a sampling principle, with the assistance of a probe, particularly an electron beam probe, in which the signal is repeatedly sampled successively at different phase points.

2. Description of the Prior Art

When, for example, a status diagram of electrical signals at at least one circuit node of integrated circuits is recorded with an electron probe in accordance with a sampling method, then the sampling window is shifted across the circuit cycle in a non-linear fashion (v. U.S. Pat. No. 4,220,854 fully incorporated herein by this reference). The electrical signal is thereby cyclically applied to the measuring point. Each time the basic pulse rate of the integrated circuit has a leading edge or a trailing edge, the potential at a measuring point is usually measured by way of repeated sampling at a specific phase of the electrical signal in accordance with the prior art. Only those phase points of the electrical signal which coincide with a leading edge or with a trailing edge of the basic pulse rate of the integrated circuit are thereby acquired by this known measuring method. With this known method, the logic state changes which appear at the respective measuring point can indeed be exactly acquired because these logic state changes coincide with leading edges or with trailing edges of the basic pulse rate of the integrated circuit. When, however, brief noise pulses (spikes) occur which do not coincide with leading edges or trailing edges of the basic pulse rate of the integrated circuit, then these noise pulses are not acquired by the known measuring method. Only when noise pulses accidentally coincide with the sampling time can such noise pulses be acquired in the execution of the known measuring method.

It was heretofore necessary to record time diagrams of the electrical signals at circuit nodes of integrated circuits in order to be able to acquire spikes that do not appear at a leading edge or a trailing edge of the basic pulse rate of an integrated circuit. This means that the entire circuit cycle is linearly recorded. The electrical signal was thereby measured and recorded in the same manner at a circuit node of an integrated circuit at every phase point that is mensurationally distinguishable from another phase point. The time spent for such an overall recording of the electrical signal, however, is very high when an electrical signal at a measuring point in an integrated circuit is measured at all phase points that can be mensurationally distinguished from one another.

SUMMARY OF THE INVENTION

The object of the present invention is to provide a method and an apparatus, generally of the type initially mentioned, which enables a fast recording of an electrical signal at a circuit node of an integrated circuit and simultaneously permits a registration, when at least one noise signal appears between two clock edges of the basic pulse rate of an integrated circuit.

In accordance with the invention, the above object is achieved in a method for measuring electrical signals according to a sampling principle with the assistance of a probe, whereby the signal is repeatedly sampled in succession at different phase points, and the method is particularly characterized in that only a check as to whether a noise signal exists in an intermediate region and is also executed at phase points by way of sampling between respectively two successively phase points at which the signal is repeatedly sampled in succession for potential measurement.

According to the invention, apparatus for implementing the method comprises an integrating circuit and a measuring potential signal output downstream of the integrated circuit and is particularly characterized in that a device is provided which, in turn, comprises two parallel, edge-controlled flip-flops, the device being connected in parallel with the integrated circuit, whereby one flip-flop is set given an edge rise and the other flip-flop is set given an edge fall of the measured signal, and in which both flip-flops are reset by a sequence control and for each sampling of the phase point of the signal whose appertaining potential is acquired in the integrating circuit, whereby the outputs of both of the flip-flops are combined in a device such that the output of the last-mentioned device represents a noise signal indication.

According to the method of the invention, one cannot only use an electron probe, but any other probe as well permits the recording of an electrical signal at a circuit node of an integrated circuit, for example a laser scanner. A method according to the invention can also be employed for the registration of electrical signals that can be acquired at outputs of an integrated circuit. The method of the invention is also fundamentally useable for the registration of signals that are not identified in an integrated circuit, but at any type of electrical line as well.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
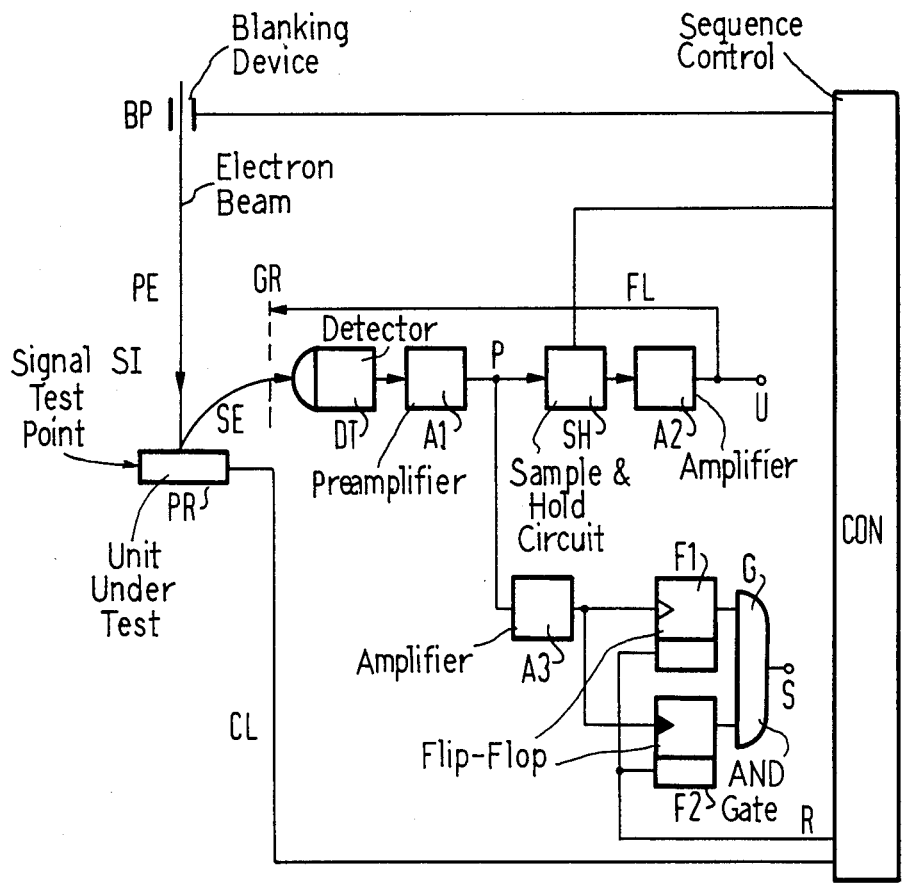
FIG. 1 is a schematic block diagram of an exemplary embodiment of apparatus for carrying out the method of the invention.

FIG. 1 illustrates, in block diagram form, an example of an apparatus for the implementation of the method of the invention. Illustrated in this example is an apparatus which is based on a known measuring installation for the implementation of a sampling method with the assistance of an electron probe.

Apparatus for the implementation of a sampling method with the assistance of an electron probe is known, for example, from the aforementioned U.S. Pat. No. 4,220,854. The implementation of a sampling method is also disclosed in this U.S. Letters Patent. A somewhat improved apparatus for the implementation of a sampling method is additionally known from U.S. Pat. No. 4,227,679, also fully incorporated herein by this reference. Given such a known apparatus for the implementation of a sampling method, primary electrons PE are shaped by way of an electron beam blanking device BP to form sampling pulses EP (FIG. 2) via a sequence control CON synchronous with the basic pulse rate CL (FIG. 2) applied to a unit under test PR. A cyclical signal SI is applied to the measuring point on the unit under test PR. The cyclical signal SI is documented in that secondary electrons SE are triggered upon incidence of the primary electrons PE on the measuring point, the secondary electrons being documented in a detector DT and being converted into a secondary electron measuring signal. This measuring signal is first amplified in a preamplifier A1. Given the known sampling method, the signal SI is sampled repeatedly in succession at one and the same phase point in order to obtain a good signal-to-noise ratio in the determination of the potential at the measuring point on the unit under test PR which appertains to a specific phase point of the signal SI. The measuring signals which belong to one and the same phase point of the signal SI are summed up in a circuit SH, for example a sample-and-hold circuit or an integrating circuit (boxcar integrator). The result of this summation is then again amplified in another amplifier A2. The measured result for the potential which is applied to the measuring point on the unit under test PR at a specific phase point of the signal SI is finally obtained at an output U of the second amplifier A2.

In order to linearize the measured result at the output U, the measuring chain comprising the detector DT, the amplifier A1, an integrating circuit SH, and the amplifier A2 is closed to form a feedback loop FL which controls the voltage at a retarding grid GR in a retarding spectrometer for the determination of the secondary electron energy.

For the implementation of the method of the invention, the measured signal is tapped at a point P between the preamplifier A1 and the integrating circuit SH and, for example, is supplied to a further amplifier A3. The output of the further amplifier A3 is fed to the edge-controlled setting inputs of two RS flip-flops F1 and F2. The output of the flip-flops F1 and F2 are combined in an AND gate G. The output of the AND gate G, finally, indicates whether a noise signal has or has not appeared in a region between two edges of the basic pulse rate CL of the unit under test PR.

Figure 2:
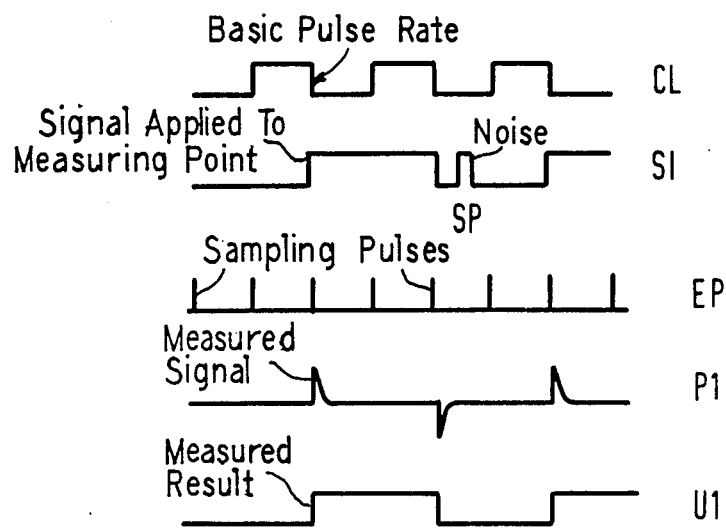
FIG. 2 is a plurality of timing diagrams that can be acquired with a known method without noise signal registration.
Figure 3:
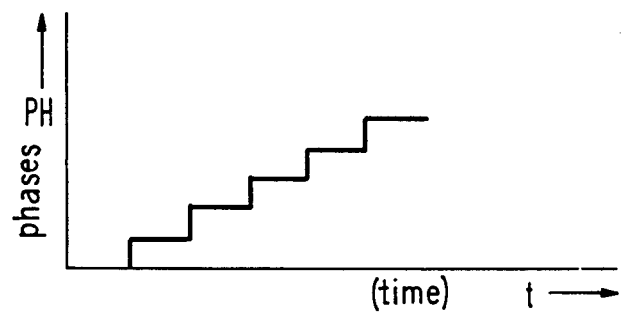
FIG. 3 is a graphic illustration of the phase progression for a measured value acquisition given a known method according to FIG. 2.

FIGS. 2 and 3 illustrate the function of a known apparatus according to the sampling method which does not permit a noise signal appearing between clock edges of the basic pulse rate CL to be documented. FIG. 2 illustrates the basic pulse rate CL at the unit under test PR, the signal SI which is applied to the measuring point in a cyclical fashion and which comprises a noise signal SP generated by the unit under test, the primary electron sampling pulses EP which appear at every edge of the basic pulse clock rate CL, the measured signal P1 at the measuring point P, and the measured result U1 at the output U. As the result U1 shows, the noise signal SP in the signal SI cannot be documented with a known method and a known apparatus.

As FIG. 3 shows, the phases PH of the phase points at which the signal SI is repeatedly sampled in succession over a finite time interval is shifted across the entire cycle of the cyclical signal SI step-by-step given a known method. Considerable spacings thereby respectively occur between the individual phases of various successive phase points, so that only a few phase points are covered given a registration of a cyclical signal SI.

Figure 4:
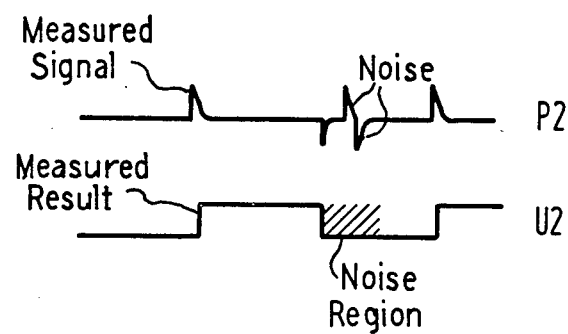
FIG. 4 illustrates, with respect to time, signals that are acquired with the method of the invention with noise signal registration in contradistinction to the signals of FIG. 2.
Figure 5:
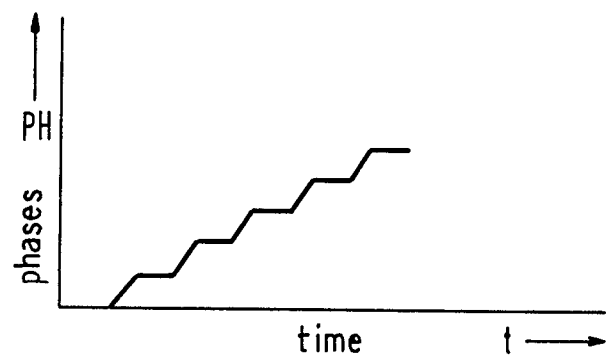
FIG. 5 is a graphic illustration of the phase progression with the measured value acquisition and the assistance of the method of the present invention.

FIGS. 4 and 5 show what improvements can be achieved by practicing the present invention and how such improvements can be obtained. FIG. 4 shows a measuring signal P2 which can be tapped at the point P with an apparatus for implementing the method of the invention. Given the method of the present invention, as shown in FIG. 5, the phase PH at which the sampling pulses EP sample the cyclical signal SI at the measuring point is not varied step-by-step in large steps as is shown in FIG. 3 for the known method, but individual phase points of the signal SI at which the phase PH remains constant over a longer time t are extracted, which means that these phase points are repeatedly sampled in succession in order to acquire a well-defined potential value which is exhibited by the measuring point at these phase points of the signal SI. Between two such phase points at which well-defined potential values U are acquired, all mensurationally-distinguishable phase points are only respectively sampled until a determination can be made as to whether a noise signal SP exists at these phase points. At these latter phase points of the cyclical signal SI, therefore, sampling is in no way undertaken until, due to a good signal-to-noise ratio, a well-defined potential value can be specified at the output U, but only until it can be specified at the output S whether a noise signal exists in the intermediate region between two clock edges of the basic pulse rate CL.

In practicing the present invention, therefore, the cyclical signal SI is also sampled at such phase points at which the rise and decay of the noise signal SP can be identified. When a primary electron sampling pulse EP impinges the measuring point at the leading edge of the noise signal SP, then a corresponding, positive signal is generated therefor in the measured signal P2 given the method of the present invention. At the trailing edge of the noise signal SP, a negative signal is generated in the measured signal P2 in an analogous fashion. The measured signal P2 is amplified in the amplifier A3 and is supplied to the edge-controlled setting inputs of the flip-flops F1 and F2. The flip-flop F1 responds to the leading edge cfthe noise signal SP and the flip-flop F2 responds to the trailing edge of the noise signal SP. The signal acquisition at the output U occurs at the same sampling times as in the known method of FIG. 2. The signal SI is sampled according to the known sampling method at these sampling times at the edges of the basic pulse rate CL, i.e. a specific phase point of the signal SI is repeatedly sampled in succession.

When at least two signal changes occur in the measured signal P2 between two such sampling times which coincide with the edges of the basic pulse rate CL, then both flip-flops F1 and F2 are set. The output S then indicates that at least one noise signal has appeared between two such sampling times which coincide with the clock edges of the basic pulse rate CL. The sequence control CON must reset the flip-flops F1 and F2 after at least every clock edge after which the phase point of the signal SI to be sampled is to be changed.

In order to obtain the measured result U2, the noise signal indicator S must also be interrogated in addition to the signal at the output U, being interrogated after every clock edge of the basic pulse rate CL after which the phase point of the signal SI is to be changed. Intermediate regions in which at least one noise signal has appeared must then be separately flagged in the reproduction of the measured status diagram U2. At least one noise signal has appeared in the shaded region given the measured result U2 in FIG. 4.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for measuring electrical signals at a point within an integrated circuit, comprising the steps of:
    applying a pulse train at a basic pulse rate to the integrated circuit to cause potentials at a selected point within the integrated circuit;
    sampling the point with a pulse electron beam to cause emission of secondary electrons representing potential at the selected point;
    converting the secondary electron emission into a measured signal representing the signal at the selected point; and
    detecting signals appearing between two successive samples as noise signals.

2. The method of claim 1, wherein the step of sampling is further defined as:
    pulsing the electron beam in synchronism with the leading and trailing edges of the pulses of the pulse train.

3. Apparatus for measuring electrical signals at a point within an integrated circuit, comprising:
    first means for energizing an integrated circuit with a pulse train having a basic pulse rate;
    second means for repetitively sampling the potentials at a selected point in said integrated, circuit and providing a corresponding first electrical signal containing a noise signal;
    a first circuit connected to said second means for summing the samples of said first electrical signal to provide a first output signal; and
    a second circuit connected to said first circuit and including a pair of edge-controlled flip-flops each including an edge-controlled input and respectively operable in response to increasing leading edges and decreasing trailing edges of said noise signal to produce respective output signals, and a logic circuit connected to each of said flip-flops for producing a second output signal representing noise appearing in said first electrical signal.

4. The apparatus of claim 3, wherein:
    said logic circuit comprises an AND gate.

5. The apparatus of claim 3, wherein:
    said second circuit comprises an amplifier connected between said second means and said pair of flip-flops.

6. A method for measuring electrical signals at a point within an integrated circuit, comprising the steps of:
    applying a pulse train at a basic pulse rate to the integrated circuit to cause potentials at a selected point within the integrated circuit;
    sampling the point with a pulsed electron beam to cause emission of secondary electrons representing potential at the selected point by pulsing the electron beam in synchronism with the leading and trailing edges of the pulses of the pulse train;
    converting the secondary electron emission into a measured signal representing the signal at the selected point; and
    detecting signals appearing between two successive samples as noise signals by activating a noise signal indicator in response to at least two signal changes of the measured signal between two successive samplings.

* * * * *